United States Patent [19]

Pham van Cang

[11] Patent Number: 4,554,663
[45] Date of Patent: Nov. 19, 1985

[54] DEVICE AND APPARATUS FOR TESTING ELECTRONIC EQUIPMENT AND PARTICULARLY TELEVISION EQUIPMENT

[75] Inventor: Luc Pham van Cang, Paris, France

[73] Assignee: Thomson-CSF, Paris, France

[21] Appl. No.: 476,020

[22] Filed: Mar. 16, 1983

[30] Foreign Application Priority Data

Mar. 19, 1982 [FR] France ................................ 82 04754

[51] Int. Cl.⁴ ............................................ G01R 31/28
[52] U.S. Cl. ...................................... 371/20; 358/10; 358/139; 371/29
[58] Field of Search ................. 371/20, 29; 324/73 R, 324/73 AT; 364/579, 580, 550, 551; 358/10, 139

[56] References Cited

U.S. PATENT DOCUMENTS

| | | | |
|---|---|---|---|
| 4,055,801 | 10/1977 | Pike et al. .......................... | 324/73 R |
| 4,168,527 | 9/1979 | Winkler ................................. | 364/580 |
| 4,215,367 | 7/1980 | Schaffer et al. ...................... | 358/139 |
| 4,240,100 | 12/1980 | Gorbold et al. ...................... | 358/10 |
| 4,268,851 | 5/1981 | Heller et al. .......................... | 358/10 |
| 4,389,710 | 6/1983 | Rasmussen ........................... | 364/551 |
| 4,417,336 | 11/1983 | Weilbacker ............................ | 371/20 |

OTHER PUBLICATIONS

T. Ikenaga, TV Measuring Instruments Making Transition to Digital Methods, JEE, Journal of Electronic Engineering vol. 18, No. 171, Mar. 1981, Tokyo, Japan, pp. 91–94.

Primary Examiner—Charles E. Atkinson
Attorney, Agent, or Firm—Oblon, Fisher, Spivak, McClelland & Maier

[57] ABSTRACT

The device comprises a generator for the analog test signals intended for the equipment to be tested, incorporating a digital computer, a device for the acquisition of the signal supplied by the tested electronic equipment in response to the test signals received by it, as well as display means controlled by the computer for displaying the signals transmitted by the test signal generator and/or the signals received by the acquisition device.

18 Claims, 14 Drawing Figures

DEVICE AND APPARATUS FOR TESTING ELECTRONIC EQUIPMENT AND PARTICULARLY TELEVISION EQUIPMENT

BACKGROUND OF THE INVENTION

1. Field of the Invention

The present invention relates to a device and an apparatus for testing electronic and particularly television equipment.

2. Description of the Prior Art

The characterization or measurement of signals on electronic equipment tested by external electrical forces is conventionally carried out with the aid of measuring means, such as voltmeters, oscilloscopes, frequency meters and distortion analyzers.

In the case of certain very specific electronic equipment, such as e.g. television equipment, the conventional means for measuring electrical or electronic quantities must be supplemented by measuring means directly adapted to the acquisition of signals generated by said equipment. Thus, in the case of colour television, designers had to design new measuring means, such as vectorscopes, noise meters, transit time meters, etc, together with test signal generators able to perform these measurements. For example, they comprise generators of signals for characterizing transients, generators of signals for characterizing amplitude—frequency or phase—frequency responses, colour pattern generators, noise generators, etc.

This has unfortunately led to a significant increase in the cost of testing equipment, which increases with the complexity of the equipment to be tested and the complication of the manipulations which have to be carried out for performing the corresponding operations.

SUMMARY OF THE INVENTION

The object of the invention is to obviate the aforementioned disadvantages with the aid of a testing device, which is itself able to carry out all the electrical measurements required for characterizing the signals of the tested apparatus, whilst having a greater flexibility of use than the prior art devices and which is adaptable without major structural modifications to the measurement and testing of a virtually unlimited number of electronic equipments.

The present invention therefore relates to a device for testing electronic equipment, wherein it comprises an analog test signal generator for the equipment to be tested and which incorporates a digital computer coupled to a digital-analog converter and means for storing the test signals in the form of digital samples, a device for the acquisition of the signal supplied by the tested electronic equipment in response to the test signals received by it, as well as display means controlled by the computer for the purpose of displaying the signals transmitted by the test signal generator and/or the signals received by the acquisition device.

According to another feature of the invention, the digital computer comprises means for producing test signals constituted by a microprogrammed processing unit incorporating a central processing unit coupled to signal descriptor storage means, as well as means for storing instruction sequences, each constituting a special elementary test signal generating program.

According to another feature of the invention, the analog test signal generator comprises a read-write memory interposed on the one hand between the digital-analog converter and the storage means, and on the other hand between the digital-analog converter and the digital computer in order to ensure the adaptation of the flow rates of information either from the computer, or from the storage means, which makes it possible, for example, in the case of the testing of television equipment, to reconstitute analog test signals in accordance with the television standards with the aid of synchronization means.

According to yet another feature of the invention, the device for the acquisition of the signals supplied by the tested electronic equipment comprises an address generator for identifying the signal which appears at the input of the acquisition device, a unit for sampling the signal received by the acquisition device and a comparator connected by one input to the output of the address generator, another input of the comparator receiving the address of the signal which has to be acquired, whilst the output of the comparator supplies a sampling unit control signal for authorizing it to acquire the current signal present at the input of the device, when the address of the current signal is equal to the address of the signal which has to be acquired.

As a result of this arrangement, all the resources necessary for producing a test signal are identifiable with the aid of signal descriptors, which can be directly addressed with the aid of e.g. a keyboard connected to the processing unit. As each descriptor in particular contains the starting address of an elementary test signal generating program, the operator can start programs corresponding to the type of test signal which it is desired to obtain directly and on the basis e.g. of the keyboard or any other access means.

This arrangement is particularly advantageous, because it makes it possible to produce a plurality of test signals formed in each case by the association of several elementary signals, which can be successively produced in time. This takes place directly through the operator choosing the various descriptors, which he requires for forming the test signal.

Another advantage of the device according to the invention is that whenever a new test signal is produced, it makes it possible to enrich the library of test signals already contained in the storage means, because the latter operation takes place by a simple transfer of the samples produced from the processing unit to the storage means.

Yet another advantage of the device according to the invention is that it permits a precise sampling of each acquired signal which, in the case of an acquisition of television signals, is translated by a fine analysis of the selected television image point. This analysis takes place selectively by designating the address of the signal, or the point in the transmitted image with the aid of the keyboard connected to the processing unit and the information characterizing the signal or the designated point is read one or more times by the computer, which consequently has all the necessary time for processing the information relative to the signal or to the point whose analysis is requested.

BRIEF DESCRIPTION OF THE DRAWINGS

The invention is described in greater detail hereinafter relative to non-limitative embodiments of an electronic equipment testing device, intended more particularly for testing colour television transmitter or receiver equipment and the attached drawings, wherein.

DETAILED DESCRIPTION OF THE INVENTION

Figure 1:
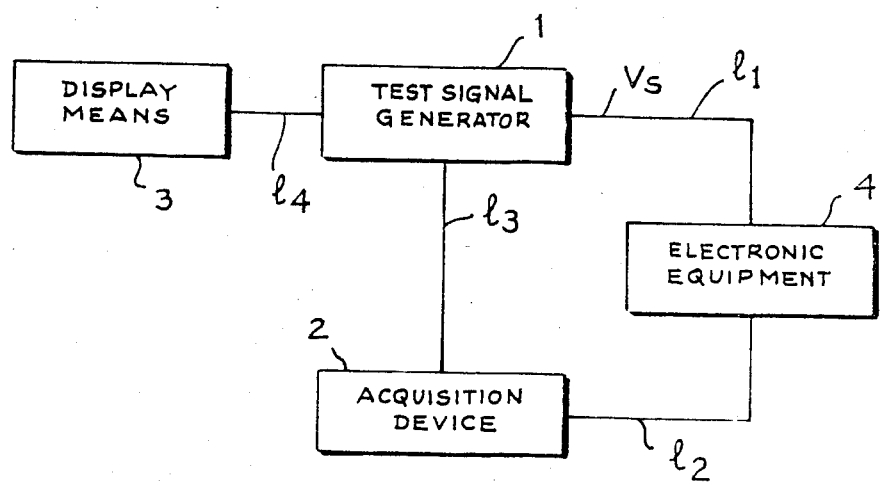
FIG. 1 shows a representation of the electronic equipment testing device according to the invention.

The device shown in FIG. 1 comprises an analog test signal generator 1 constituted by a computer, an acquisition device 2 and display means 3. The television equipment 4 to be tested is coupled on the one hand, by a line $1_1$, to an output of the signal generator 1 and on the other hand, by a line $1_2$, to the acquisition device 2 for supplying the latter with the television signals obtained with the response to the force signal supplied by the generator 1. A line $1_3$ transfers information between generator 1 and acquisition device 2. Generator 1 is coupled to the display means 3 by a line $1_4$.

The conformation of the television signals involved here need not be described for understanding the present invention, but it is pointed out that these signals are as defined by the international standards in force and a description thereof can be found in the book entitled "Radiotechnique et Télévision", pages 186 to 190, by Bogdan Grabowski, published by Société DUNOD (Paris).

Figures 2, 3:
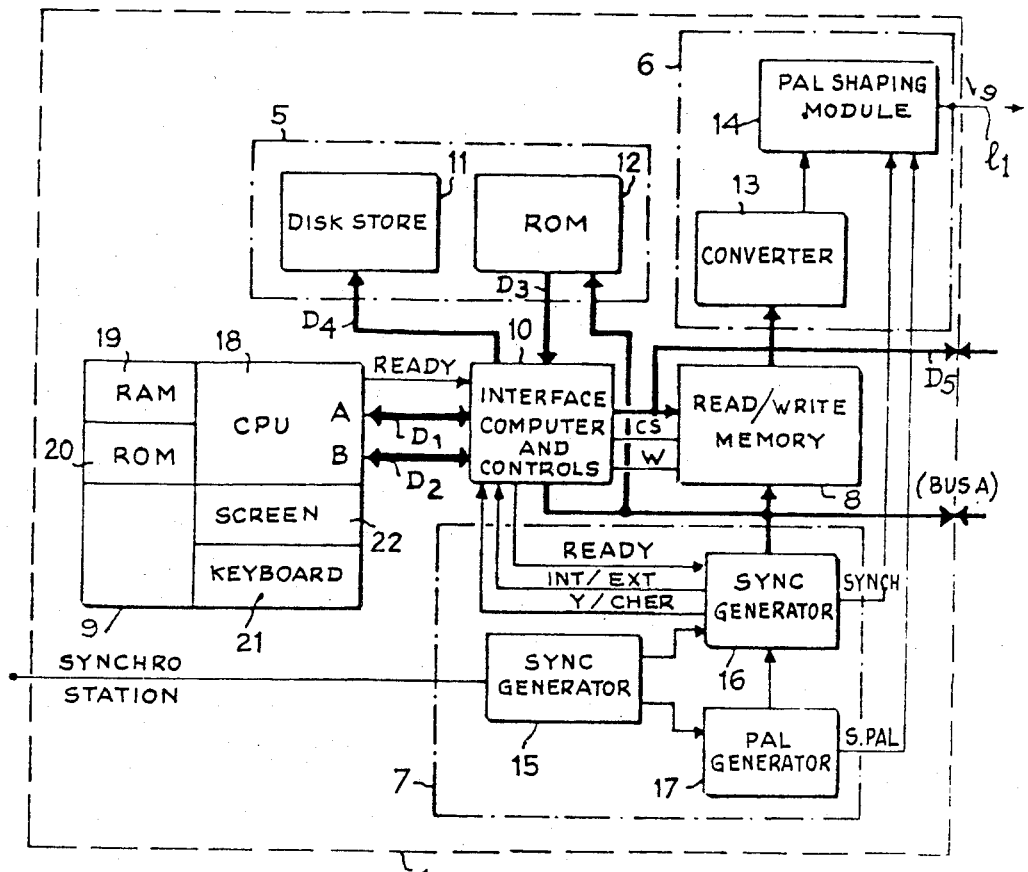
FIG. 2 is a block diagram of the analog television test signal generator according to the invention.
FIG. 3 shows a representation of a signal descriptor.

The analog test signal generator is shown in FIG. 2. It comprises storage means 5, a digital-analog converter 6, synchronization means 7, a read-write memory 8 and a computer 9. An interface 10 ensures the connections between the storage means 5 and the read-write memory 8, said interface being controlled by computer 9. Computer 9 is connected by its gates A and B to interface 10 by means respectively of data line $D_1$ and the data destination control line $D_2$. The data pass between the storage means 5 and interface 10 by means of data lines $D_3$ and $D_4$. The data pass from interface 10 to memory 8 and acquisition device 2 along data line $D_5$. The latter is bidirectional, i.e. it can also transmit data from acquisition device 2 or read-write memory 8 to interface 10. Line $D_5$ is connected to the acquisition device by means of line $1_3$ of FIG. 1.

The storage means 5 comprise a mass store 11 and a read-only memory 12. The mass store 11 has a very large capacity and contains the library of test signals of the device. It can comprise a disk or small disk store. The transfer of signals between the mass store 11 and interface 10 takes place on data line $D_4$ under the control of computer 9. The read-only memory 12 contains a set of preprogrammed test signals. This set of signals can consist of a very small number and can be constituted by the signals most frequently used for testing television equipment and for permitting rapid testing without involving the test signal library contained in mass store 11.

The digital-analog converter 6 comprises a converter 13, whose inputs receive the digital signal read into memory 8 and whose output supplies an analog signal for a signal shaping stage 14, whose output supplies an analog signal $V_S$ on line $1_1$ connecting generator 1 to the tested electronic equipment.

The synchronization means 7 are constituted by a sync generator 15, a SYNC synchronizing signal generator 16 and a PAL synchronization signal generator 17 for the shaping stage 14. The read-write memory 8 is constituted by a random-access memory or RAM.

The read-write memory 8 and the read-only memory or ROM 12 are addressed by a common address bus BUSA along which pass the addresses from the synchronization systems 7 or computer 9 via interface 10. The address bus BUSA is also connected to the acquisition device by line $1_3$ in order to enable computer 9 to transmit the addresses of the samples which it wishes to acquire to the acquisition device.

Computer 9 is in the form of a microcomputer and to this end is formed in per se known manner by a central processing unit CPU 18, constituted e.g. by a microprocessor, interconnected on its data and address buses to a central memory RAM 19 and to at least one read-only memory ROM 20. For further details on the construction of microcomputers, reference can be made to the book entitled "Microprocesseurs et microordinateurs" by R. LYON CAEN and J. M. CROZET, published by Masson, Paris 1977, or the book entitled "Minicomputer systems" by Cay WEITZMANN, published by Prentice Hall Inc., New York, 1974, The ROM 20 contains all the tables and microprogrammes necessary for performing the information or data transfers between the storage means 5 and the read-write memory 8, as well as those necessary for producing new test signals. The checking and control of these transfers are ensured by the execution of input-output instructions, whose realisation is generally indicated in the technical specifications of the presently available microprocessors and which therefore need not be described for the purpose of understanding the present invention. The tables used for generating test signals are formed by areas of ROM 20 containing the signal descriptors.

The format of a signal descriptor is shown in FIG. 3, where descriptor 23 is constituted by zones 24 to 28 bis. Zone 24 stores the type of descriptor and makes it possible to recognise the descriptor, when it is selected on the keyboard by the operator. Zone 25 contains the starting address of the test signal generating program, corresponding to the descriptor, said program being stored in ROM 20. The zone 26 specifies the address $AZ_1$ of an area of the central memory 19 in which is stored the amplitude of the first sample of the signal corresponding to the descriptor and on the basis of which are stored the following samples of the signal. Zone 27 specifies the address $AZ_2$ of an area of the central memory 19 in which is stored the signal starting time. Zone 28 specifies the address $AZ_3$ of an area of the central memory 19 in which is stored the amplitude of the end of the signal. Zone 28 bis specifies address $AZ_4$ of an area of central memory 19 in which is stored the time indicating the end of the signal. The address zones $AZ_1$ to $AZ_4$ of the central memory are written on the basis of keyboard 21 once the operator has selected the descriptor.

Figure 4:
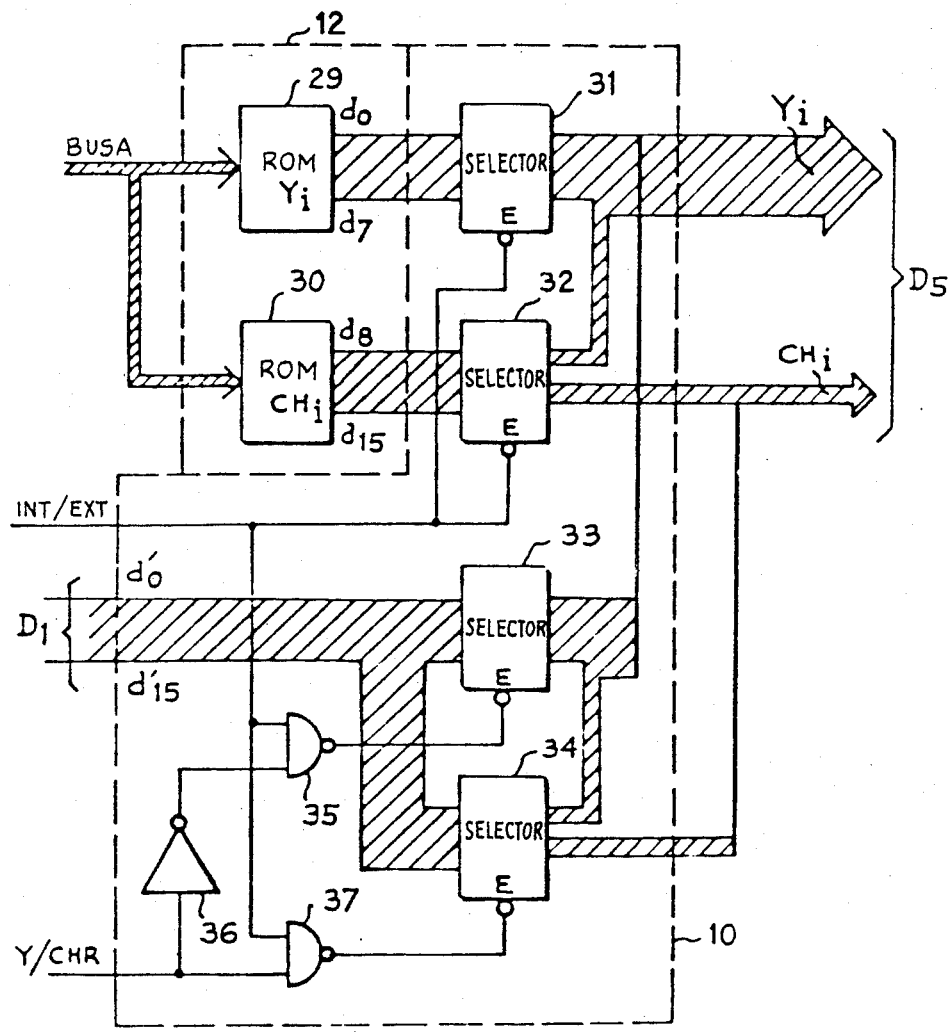
FIG. 4 is a view of read-only memories incorporating storage means and their associated circuits.

The connections of the ROM 12, as well as the connections of computer 9 to the read-write memory 8 are shown in FIG. 4, in which the ROM 12 is constituted by two memory units 29, 30. Memory 29 contains luminance signal samples $Y_i$ and memory 30 contains chrominance signal samples $CH_i$. A configuration plan of these memories can be obtained, e.g. with the aid of two 32K bit ROM's of type 2732, marketed by the MOTOROLA company, which corresponds to a capacity of 4k words of 16 bits, which can therefore collect two test signals of 2048 samples each. On the basis of this organisation, a 16 bit word read into memory 12 is placed on outputs d0 to d15 of said memory, outputs d0 to d9 transmitting the luminance bits, outputs d10 to d13 the chrominance bits and output d15 a control bit. Outputs d0 to d7 of memory 29 are connected to the respective inputs of a selector 31 and outputs d8 to d15 of memory 30 are connected to the respective inputs of a selector 32. Selectors 31 and 32 respectively transmit the bits of luminance samples $Y_i$ appearing at outputs d0 to d7 and the bits of chrominance samples $CH_i$ appearing at outputs d8 to d13 of memories 29 and 30 on data line $D_5$, when they are controlled on their input E.

The data $d'_0$ to $d'_{15}$ on data line $D_1$ from the computer are applied to the respective inputs of selectors 33 and 34. Said data are transmitted by the outputs of selectors 33 and 34 to data line $D_5$, when the inputs E of selectors 33 and 34 are validated. The validation of inputs E of selectors 33, 34 takes place in the following way. Selectors 31, 32 are controlled when the device is synchronized by external clock signals coming, for example, from a television transmission station. Selectors 33, 34 are controlled when the device is not connected to a station and operates in an internal mode on an internal clock. Input E of selector 33 is connected to the output of the NAND gate 35 which has two inputs, one input receiving an internal-external control signal INT/EXT from synchronization means 7 and the other input is connected to the output of the inverter amplifier 36, which receives on one input a signal Y/CHR, which also comes from the synchronization means 7. Input E of selector 34 is connected to the output of NAND gate 37 having two inputs, one of which receives the internal-external signal and the other receiving the signal Y-CHR. When in a first state, signal Y-CHR controls the selection by selector 33 of samples $Y_i$ of the luminance signals placed on line $d'_0$ to $d'_7$ of the data line $D_1$ and, when in the second state, controls the selection by selector 34 of sample $CH_i$ of the chrominance signals placed on lines $d'_8$ to $d'_{13}$ of the data line $D_1$.

Figure 5:
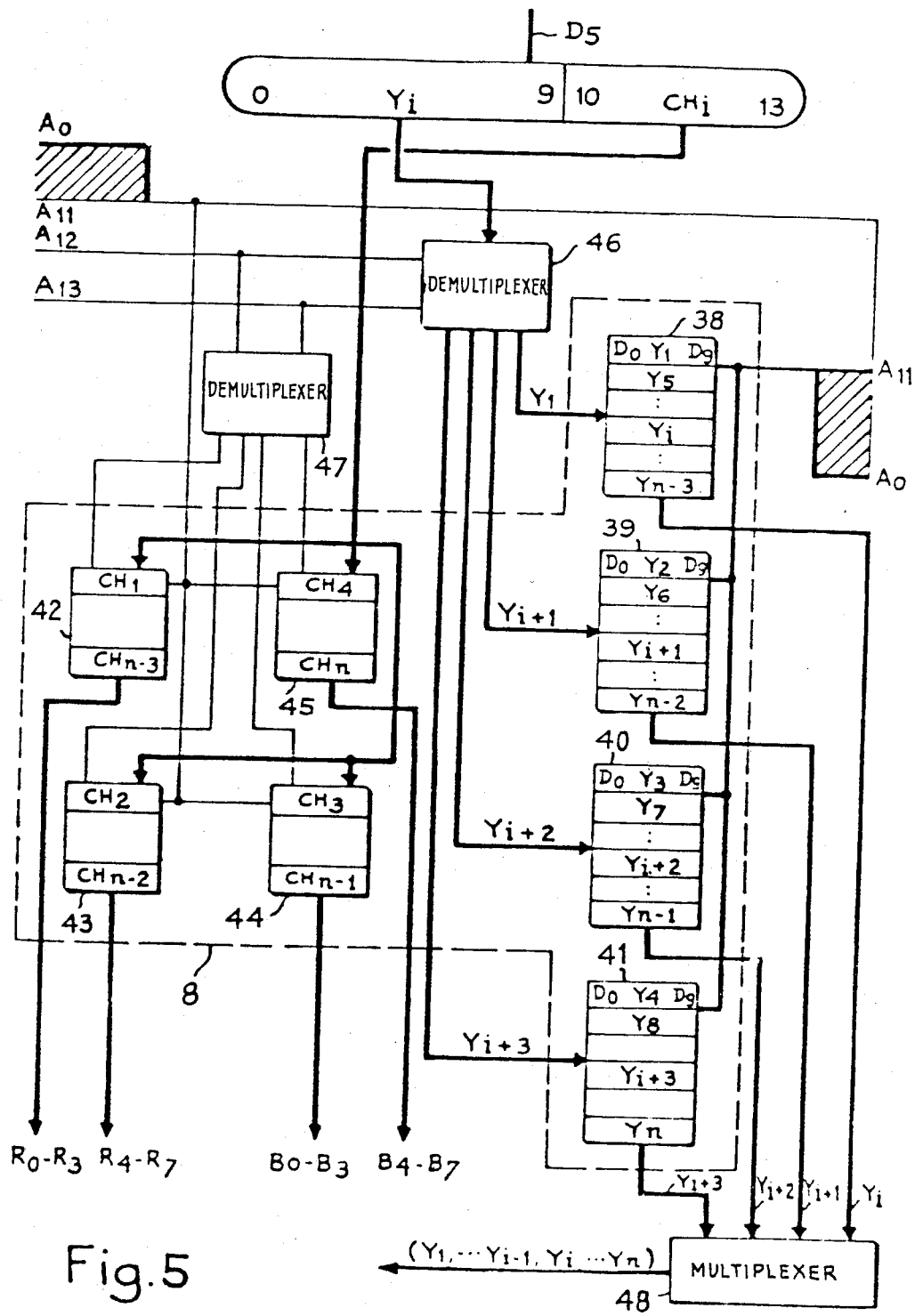
FIG. 5 is a view of the addressing circuits and the organization of the read-write memory.

An example of the organisation of the read-write memory 8 is shown in FIG. 5. Memory 8 is constituted by fast memory circuits, e.g. static CMOS circuits, whose cycle time is approximately 100 nanoseconds. In order to permit their operation at a frequency of 32 MHz, which corresponds to the transmission of 2048 samples per television line, said circuits are demultiplexed on writing and multiplexed on reading by four in order to make the multiplexing transparent to the user.

In a possible embodiment, 4K bit circuits can be used which, bearing in mind the multiplexing by four, makes it possible to keep a complete set of 8 test signals in each circuit. In this case, 40 circuits are required for storing luminance samples coded on 10 bits, whilst 16 circuits are required for storing two chrominance samples. In the embodiment of FIG. 5, memory 8 contains four storage units 38 to 41 for storing luminance signals Y1 to YN and four storage units 42 to 45 for storing chrominance signals CH1 to CHN. Stores 38 to 41 are subdivided into 10 bit words, each representing luminance samples, whilst stores 42 to 45 are subdivided into four bit words, each representing a chrominance sample. Each 10 bit or 4 bit word contained in one of the stores 38 to 45 is addressed by wires A0 to A11 of address bus BUSA. The luminance words d0 to d9 and the chrominance words d10 to d13 transmitted on bus $D_5$ are respectively applied on the one hand to the input of a demultiplexer 46, and on the other hand to the input of a demultiplexer 47. Demultiplexer 46 switches the sequence Y1 to YN of luminance words, constituted by bits d0 to d9, successively into one of the four storage units 38 to 41, in such a way that store 38 contains words Y1, Y5 ... Yi Yi+4 ... YN−3, memory 39 contains words Y2, Y6 ... Yi+1, Yi+5, YN−2, memory 40 contains words Y3, Y7 ... Yi+2 Yi+6 ... YN−1 and memory 41 contains words Y4, Y8, ... Yi+3, Yi+7 ... YN. The demultiplexer 47 switches the chrominance words CH (d10 to d13) into one of the four storage blocks 42 to 45 in a cyclic manner, whilst starting with store 42 and finishing with store 45.

The control of data switching into each of the units 38 to 41 on the one hand and 42 to 45 on the other is ensured by the address wires A12, A13 of address bus BUSA, which are connected to the control inputs of demultiplexers 46, 47. The luminance words are read across multiplexer 48, which supplies at its output, the luminance words Y1 to YN in the direction of converter 13, when they are successively read into storage units 38 to 41. The chrominance words which are read into units 42 to 45 are respectively applied to lines R0–R3, R4–R7 and B0–B3, B4–B7 for converter 13.

Figure 6:
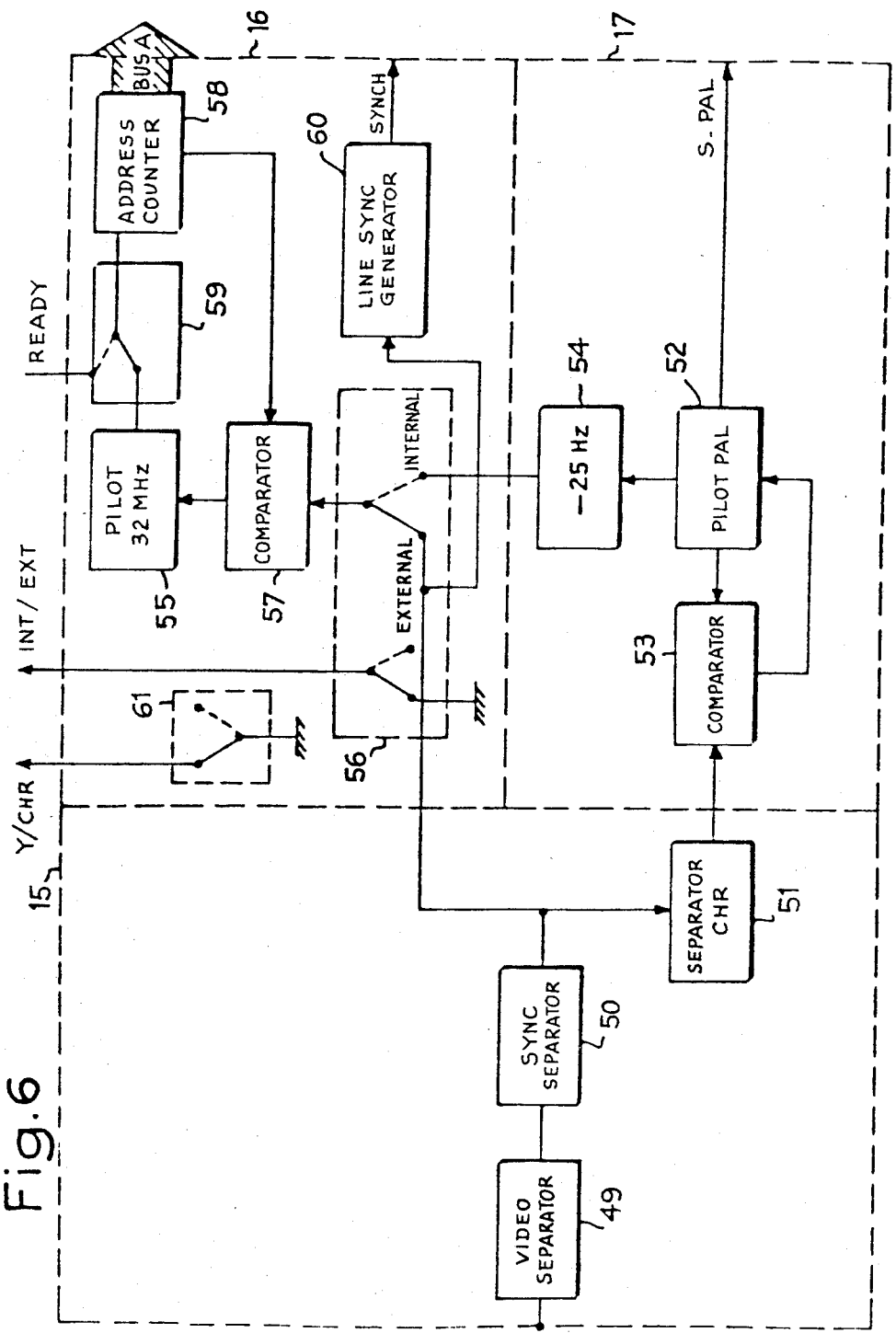
FIG. 6 shows a view of the synchronization means.

FIG. 6 shows in block diagram form an embodiment of the synchronization means. The latter serve to reconstitute the ordinary SYNC synchronization luminance signals and S/PAL television chrominance signals. These synchronization means can themselves be synchronized from an internal television generator located e.g. in a television station or can operate solely in an internal synchronization mode with an internal clock.

When the test signal generator is supplied by an external television signal generator, it applies a television signal to the input of sync generator 15. The latter comprises a video signal separator 49, which receives the television signal on its input and which supplies the sync pulse separator 50 at its output. It also comprises a chrominance signal separator 51, whose input is coupled to the output of sync separator 50. The output of separator 51 supplies the input of the standard PAL sync signal generator 17, which is formed in per se known manner by an oscillator 52 and a comparator 53, which supplies a voltage controlling the adjustment of the frequency of the oscillator, when a variation is detected between the frequency of the oscillator and the frequency of the signal supplied by the chrominance signal separator 51. The frequency of oscillator 52 is displaced by 25 cycles by a frequency subtracter 54, which receives at its input the frequency of the PAL television standard supplied by oscillator 52.

The sync signal generator 16 comprises a 32 MHz frequency oscillator 55, which is synchronized on the frequency supplied by sync separator 50 or on the frequency supplied by frequency subtracter 54. The switching to one of these two frequencies takes place with the aid of switch 56, which in an external operating mode connects separator 50 to the input of comparator 57, and in an internal operating mode connects the output of subtracter 54 to the input of comparator 57. Switch 56 also transmits the INT/EXT signal to interface 10 for controlling selectors 31 to 34.

Generator 16 also comprises an address counter 60, whose outputs are directly connected to address bus BUSA, for carrying out the addressing of the read-write memory 8 and ROM 12. A switching means 59 controlled by computer 9 connects the clock input of counter 59 either to the output of oscillator 55, or to the output of the input-output interface 10, which transmits the ready signal from the computer. In this way, the samples stored in memory 19 of computer 9 can be transferred into the read-write memory 8 with the timing of the ready signal transmitted by the computer and can be read into the memory 8 with the timing of the 32 MHz signal supplied by oscillator 55. A switch 61 transmits the signal Y/CHR for the selection of luminance and chrominance samples for interface 10.

Figure 7:
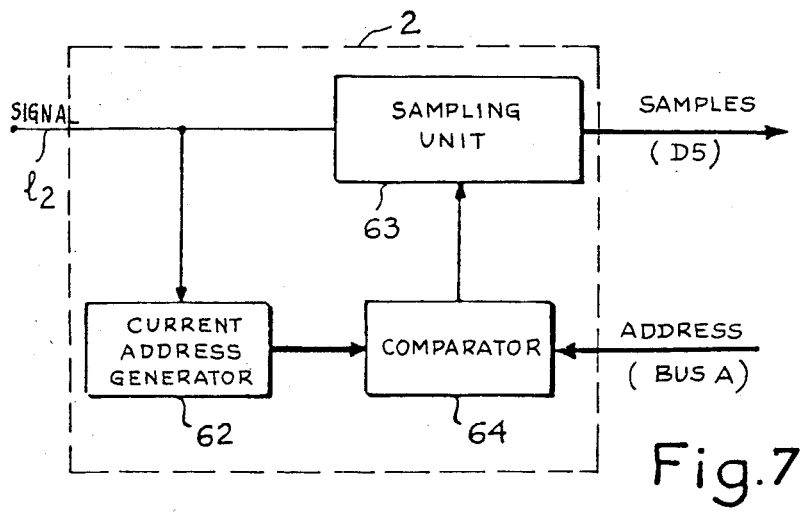
FIG. 7 is a block diagram of the television signal acquisition device according to the invention.

The digital signal acquisition device 2 is shown in block diagram form in FIG. 7. It comprises a current address generator 62, a sampling unit 63 and a comparator 64. In the present context, the expression "current address" designates the address of the current or actual point of the television image being transmitted, the associated television signal being applied to the input of the device in order to optionally be acquired.

This signal is transmitted in accordance with a sequence corresponding to the analysis of the image by the television equipment 4 to be tested, which can be a television camera, a television transmitter, or any other television image or picture generator. It is applied by line $l_2$ to the respective inputs of the current address generator 62 and the sampling unit 63. At a given time, the current address generator 62 calculates for the television signal received, the address of the image point corresponding thereto and transmits this address to an input of comparator 64, which receives via the address bus BUSA on another input, the address of the designated point in the image for which a characterization of the corresponding television signal is requested by computer 9 for comparing said address with the current address supplied by the current address generator 62. The result of the comparison is transmitted to a control input of sampling unit 63. When the latter is controlled by comparator 64, the television signal present at the input of unit 63 is taken into account by the latter in order to be converted into a sequence of digital samples, which are transmitted by data line $D_5$ to interface 10 of the test signal generator of FIG. 2.

The constructional details of the device shown in FIG. 7 will now be described with the aid of the embodiment of the invention shown in FIG. 8. The current address generator 62 is shown within a dotted line rectangle and comprises an input selector 65, a sync separator 66, an internal clock control device formed by a phase comparator 67, an oscillator 68, a programmable horizontal address counter 69 and a programmable vertical address counter 70. Input selector 65 has a plurality of inputs, which can in each case be connected to a plurality of outputs of the television equipment 4 to be tested, in order to be selectively connected to the input of the acquisition device. The television signal transmitted by the selected output is received at the input of a sync separator 71, which separates the line and frame sync pulses from the television signal. The line sync pulses from separator 66 are applied to an input of phase comparator 67 which, on another input, receives the pulses of the same frequency as that of the line sync pulses supplied by counter 69. Counter 69 comprises 10 multivibrators and has a capacity of 2048. It advances then with the timing of the signal supplied by oscillator 68, whose frequency in the present embodiment is 32 MHz. The clock pulses supplied by counter 69 consequently have a cycle of 64 microseconds, which corresponds to the duration of a standard television image scanning line. Comparator 67 compares the phase of the signal pulses transmitted by counter 69 with the phase of the line sync pulses of the television signal received in order to supply a control signal for adjusting the phase of the signals supplied by oscillator 68, so as to cancel out the phase swing between the sync pulses received and the pulses supplied by counter 69. The pulses supplied by counter 69 are also applied to the input of the vertical counter 70 in order to permit the latter to advance with the timing of the line sync pulses of the television signal and to counter the image lines received by the device. In the present embodiment, counter 70 comprises 10 multivibrators and is reset by the frame synchronization resetting pulses supplied by sync separator 66 every 625 lines, in order to be able to operate with a television system having 625 lines per picture. The outputs of counters 69 and 70 are respectively connected to the first inputs of comparators 72, 73 forming comparator 64 and consequently transmit to the inputs of said comparators, the addresses of the current image point within the television image. The address position of the line is supplied by counter 70 and the position or address of the point on the line is supplied by counter 69.

Figure 8:
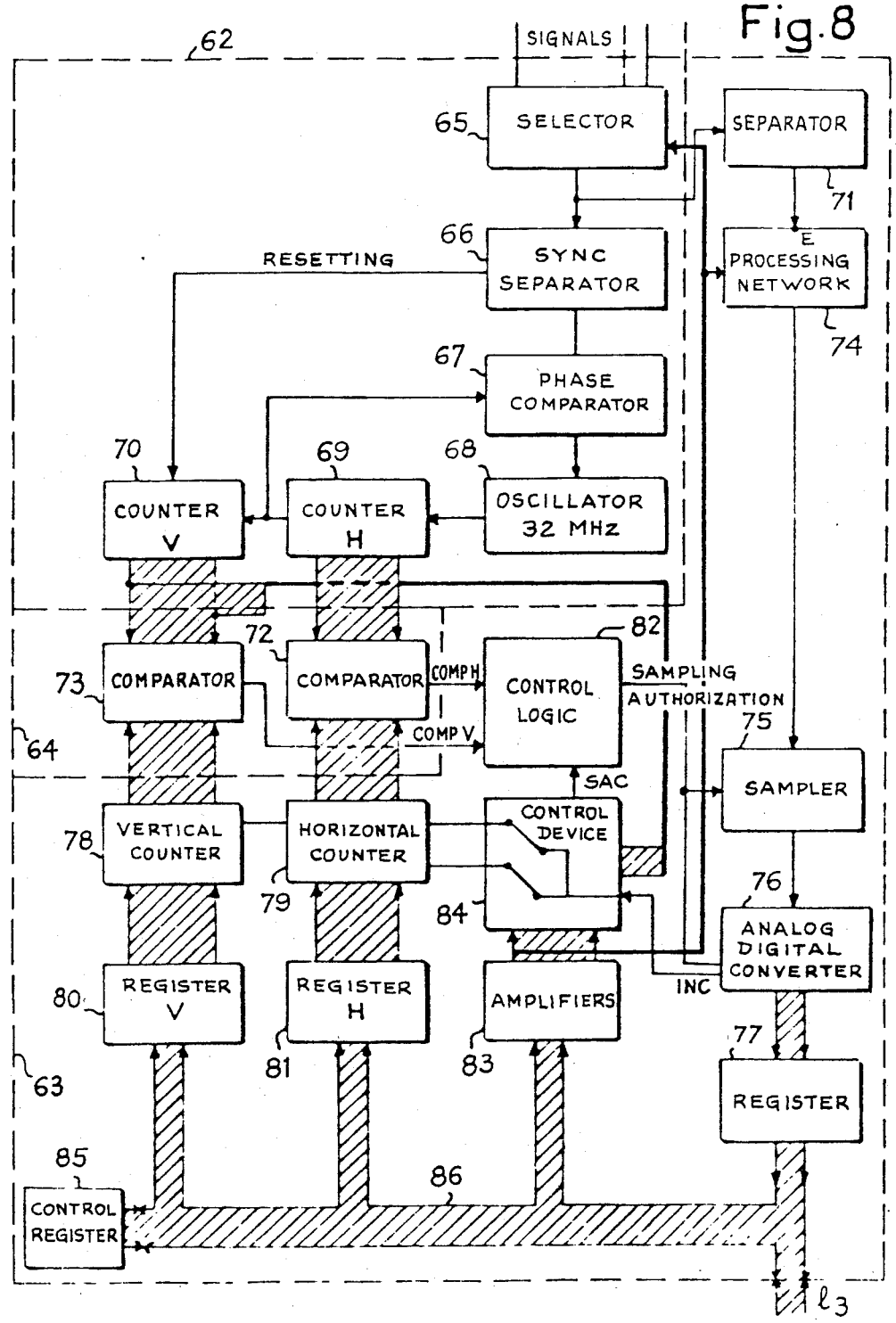
FIG. 8 is a detailed view of the components forming the device of FIG. 7.

The sampling unit 63 is shown within dotted lines in FIG. 8. It comprises a television signal separator 71, a television signal processing and shaping network 74, a sampler 75, an analog-digital converter 76 and a register 77. Sampling unit 63 also comprises programmable address counters 78, 79, whose programmable inputs are respectively connected to the outputs of registers 80, 81 and whose outputs are connected to second inputs of comparators 73, 72 respectively, a control logic 82, control amplifiers 83, a device 84 for controlling the advance of counters 78, 79 and for controlling control logic 82, as well as a control register 85. A bidirectional signal transmission bus 86 connects the inputs of registers 80, 81 and amplifiers 83, as well as the inputs of control register 85 and the outputs of register 77 for bringing about the connection of the device to the address bus BUSA and data line $D_5$ of the test signal generator of FIG. 2 via line $l_3$. The television signal separator 71 has its input connected to the output of selector 65 and thus receives the television signal selected by the input selector. The output of separator 71 is connected to the input of the television signal processing and shaping network 74, whose components are shown in FIG. 9.

Figure 9:
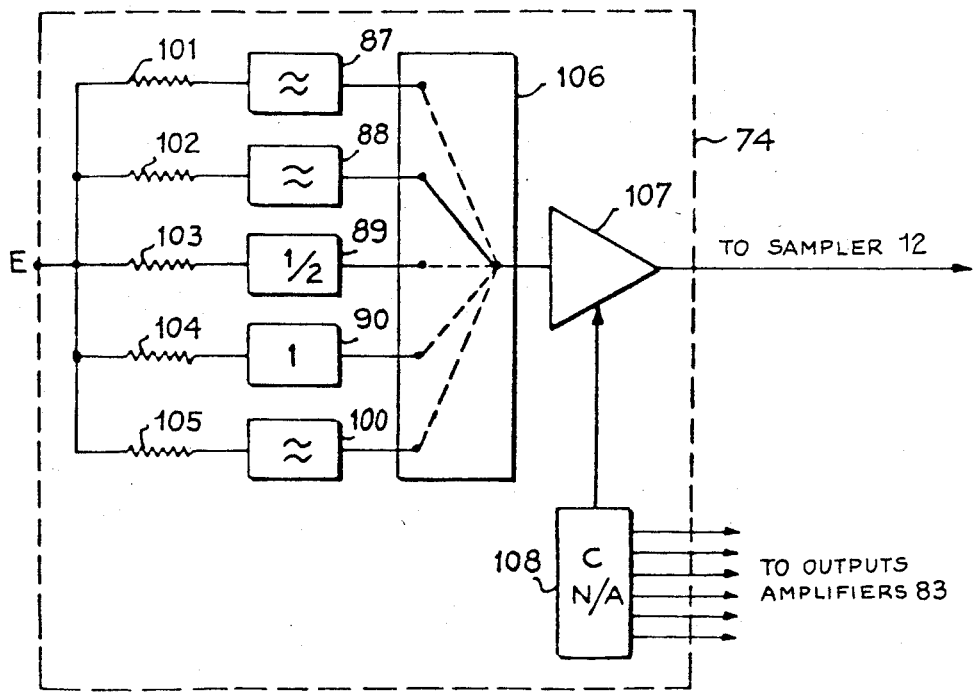
FIG. 9 details an embodiment of the signal processing and shaping network of FIG. 8.

The processing and shaping network of FIG. 9 is constituted by a low-pass filter 87, a high-pass filter 88 and an attenuator 89 of attenuation ratio $\frac{1}{2}$, an attenuator 90 of attenuation ratio 1, and a low-pass filter 100. The inputs of the above components are respectively connected to input E of network 74 across the respective resistors 101 to 105. The respective outputs of the above components 87 to 100 are connected to the respective inputs of a selector 106, whose output is connected to the input of a variable gain amplifier 107, controlled by the output of a digital-analog converter 108. The inputs of converter 108 are respectively connected to the outputs of control amplifiers 83. Network 74 can therefore be directly controlled, on the basis of control data from computer 9 so as to select the desired signal processing mode, by positioning the corresponding input of selector 106 on one of the correction elements 87 to 100 and by adjusting the output level of digital-analog converter 108 to adjust the gain of amplifier 107. The signal from amplifier 107 is then applied to the input of sampler 75 of FIG. 8. The control input of sampler 75 is connected to the output of control logic 82, which supplies a control signal, when a conversion authorization is given by comparator 64 or by control device 84.

Figure 10:
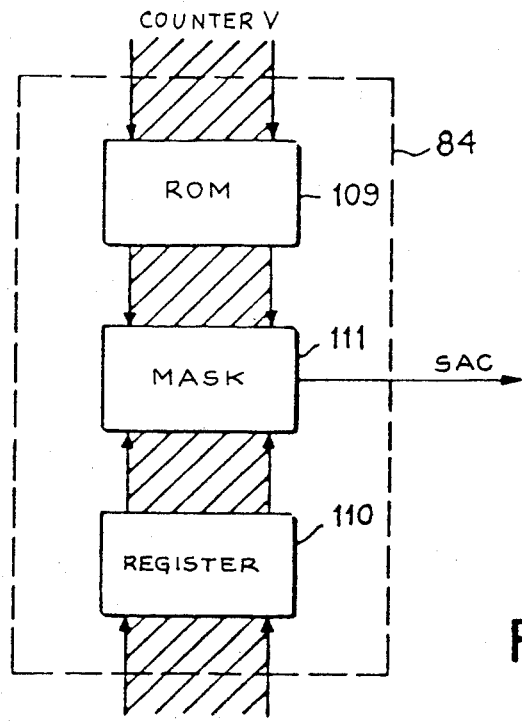
FIG. 10 details the control signal decoder of FIG. 8.

Control device 84 is shown in FIG. 10 and comprises a ROM 109, addressed on its inputs by vertical counter 70, an operation authorization register 110 connected by its inputs to the outputs of amplifiers 83 and a masking circuit 111, whose first inputs are connected to the outputs of memory 109 and whose second inputs are connected to the outputs of register 110.

Memory 109 contains preprogrammed conversion authorizations for the particular lines of the television image, making it possible e.g. to select the particular test lines in each frame of the image, or to carry out measurements on a complete frame. The preprogrammed authorizations appear on the output wires of memory 109 when they are appropriately addressed by counter 70. These authorizations can all be validated or can be partly masked by masking information bits contained in register 110, having been loaded beforehand by the computer outside the device. The validation of the conversion authorizations is carried out in per se known manner by masking circuit 111, which supplies at its output a conversion authorization signal SAC, whenever a conversion authorization supplied on an output of memory 109 is validated by the content of register 110. The conversion authorization signal SAC is transmitted to the output of control device 84 for the control logic 82.

Figure 11:
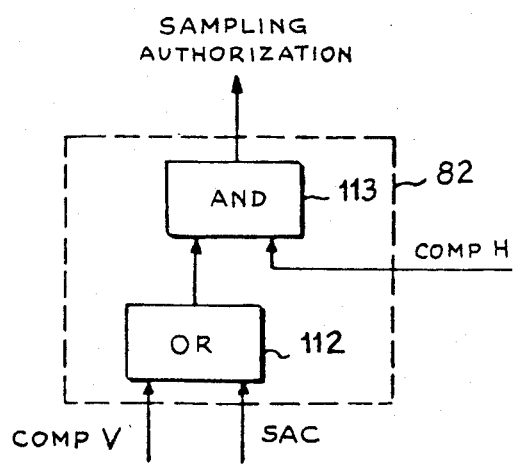
FIG. 11 shows a view of the logic control of FIG. 8.

Control logic 82 is shown in FIG. 11 and comprises an OR gate 112, connected by a first input to the output of control device 84 transmitting signal SAC, by a second input to the output of the vertical comparator 73, and by its output to a first input of an AND gate 113, whose other input is connected to the output of the horizontal comparator 72. The output of the AND gate 113 constitutes the output of control logic 82 and supplies a sampling control signal whenever an address equality is detected by the vertical detector 73, or a conversion authorization signal SAC is supplied by the control device 84 and the horizontal comparator 72 finds an address equality between the contents of counters 69 and 79.

When the sampling device 75 is controlled by control logic 82, the sample of the signal measured by sampling device 75 is applied to the input of the digital-analog converter 76. Control logic 82 also initiates a conversion cycle of converter 76 in order to transform the amplitude of the sample applied to the converter input into a digital quantity, which is transmitted to the input of the storage register 77. The register 77 serves as a buffer between the acquisition device and the interface 10 coupled to computer 9.

At the end of its conversion cycle, the analog-digital converter 76 transmits a signal INC to the programmable counters 78 or 79 in order to increment their content by 1 unit. This incrementation is authorized by control amplifiers 83, whose inputs receive control pulses transmitted by computer 9 across the interface 10 by means of line $D_5$.

The validation means 3 are constituted by screen 22 of computer 9 and permit a graphic representation of the television signal to be characterized. For this purpose, the computer transfers into its central memory 19, all the data relative to one or two television lines corresponding to 4 or 8 kbytes, on considering a system of 2048 points per line. The size of each sample is reproduced on the screen, with a timing defined by the computer in such a way that the samples are reproduced in the order of the sampling times, so as to reconstitute the acquired television signal. The display means making it possible to obtain this result are well known in the art and consequently will not be described here.

It is also possible to improve the display means by providing the computer with supplementary programming means in order to regulate, at random, the intervals between successive samples located on the horizontal axis of the screen and for producing an automatic marker giving the marked point time and amplitude digital values.

The operation of the device described hereinbefore will now be explained with the aid of the flow chart of FIG. 12, which shows the various procedures which can be carried out by computer 9. The performance of these procedures takes place in an interactive manner by a dialogue between computer 9 and an operator in front of keyboard 21 and screen 22.

In stage 114, computer 9 offers the operator a choice between three types of procedure. A first or so-called transfer procedure 115, performable in stages 116 to 118, makes it possible to carry out either information transfers (stage 116) between the central memory 19 of computer 9 and the read-write memory 8, or information transfers between the central memory 19 of computer 9 and the memory of storage device 5 (stage 117), or information transfers directly or via computer 9 between read-write memory 8 and storage device 5 (stage 118), or direct or indirect transfers between the register 77 of the acquisition device and the read-write memory 8 (stage 118 bis.).

Each of these procedures represented in stages 115 to 118 involve the carrying out of input - output instructions which are well known in the art and which will not therefore be described here.

Figure 12:
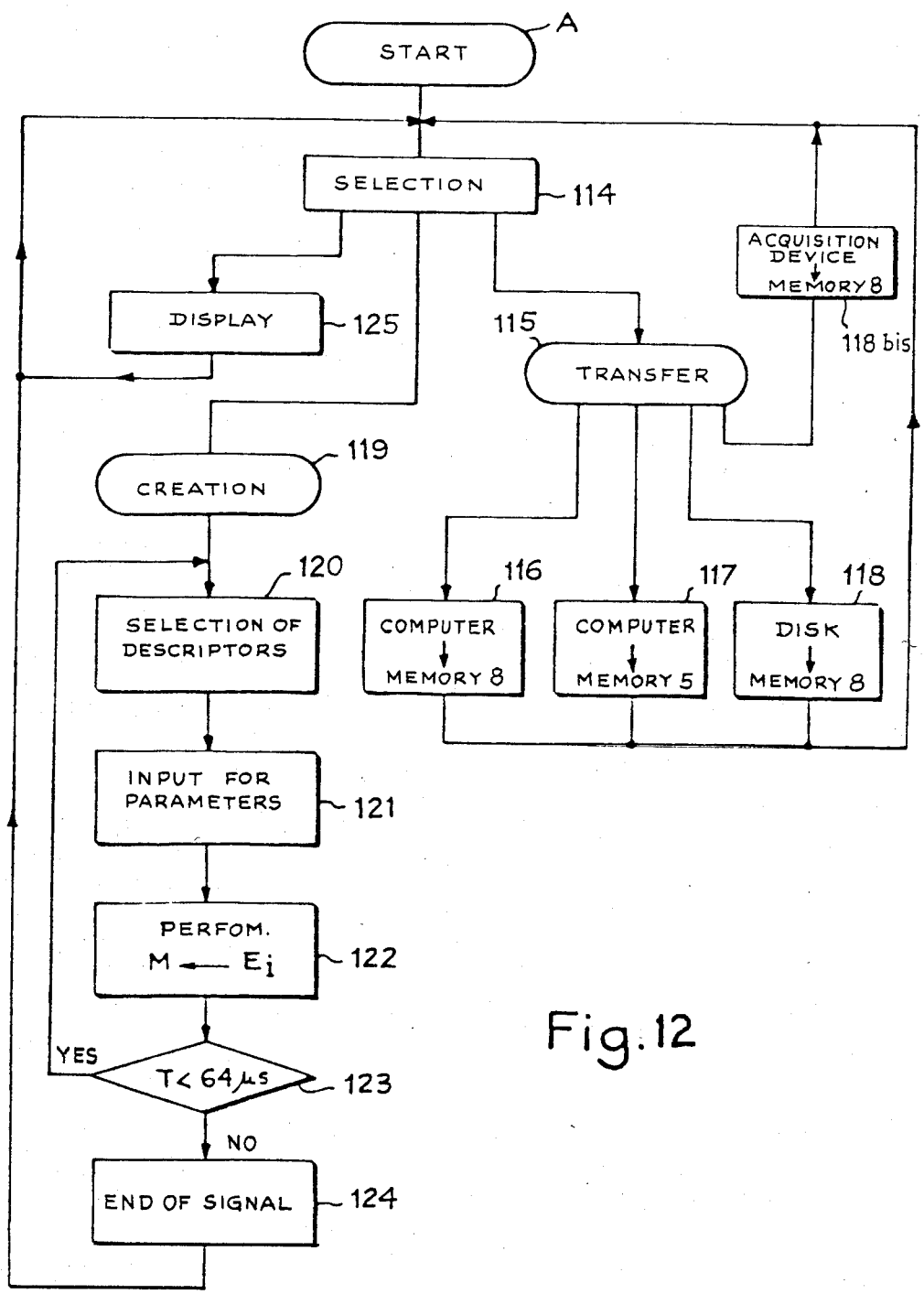
FIG. 12 is a flow chart showing the general operation of the device.

A second or so-called signal production procedure 119 is represented by stages 120 to 124 of FIG. 12. It enables the operator to produce at random a large variety of signals by associating in any random manner a plurality of elementary signals having predetermined configurations. The configuration of an elementary signal can be represented with the aid of a mathematical function $y = f(t)$ of a random nature in which y represents the amplitude of the signal and f(t) a mathematical function of time. For example, f(t) can be a constant, a linear function of time, a trigonometric function, etc. A function representing an elementary signal can be obtained with the aid of a subprogram, which can be stored within ROM 20 of computer 9, or can be loaded from the disk store 11 into the main store 19 at the time of its performance.

The successive performance of several subprograms, each corresponding to a function $y = f(t)$ makes it possible to obtain a sequence of elementary signals which succeed one another in time.

The subprogram associated with each elementary signal is addressed from a signal descriptor, which supplies the subprogram starting address into ROM 20 of the computer, as well as the address $AZ_1$ of the data zone located in central memory 19, in which are stored the digital samples of the signal during the performance of the subprogram.

Each descriptor is selected in stage 120 by the operator, who types the desired descriptor form on the keyboard. During stage 121, the parameters of the signal are introduced into the central memory 19 at the addresses specified by zones 26 to 28 bis of the descriptor. The subprogram addressed by the selected descriptor is started in stage 122.

Figure 13:
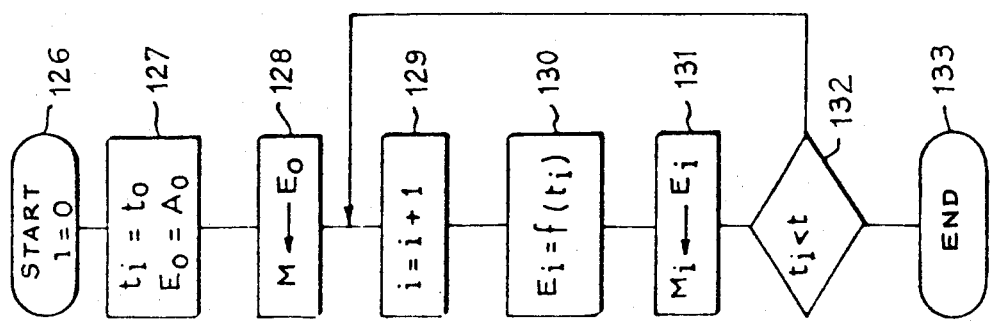
FIG. 13 is a flow chart for the organization of a subprogram for the calculation of an elementary signal.

A flow chart of the performance of a subprogram is shown in FIG. 13. Initially, at time $t=t_o$, during stages 126 to 128, the amplitude of the first sample $E_o$ is made equal to $A_o$ and sample $E_o$ is stored at the first address of the data area in the central memory pointed by the corresponding descriptor. Then, at the successive times $t_i$, defined by the sampling period, the subprogram calculated at stages 128 and 130 the amplitude of samples $E_i$ in accordance with the equation $E_i = f(t_i)$, in which f is the mathematical function making it possible to obtain the amplitude of the signal as a function of time. In stage 131, the calculated samples $E_i$ are stored at the successive addresses of the data area reserved for the descriptor. Calculation stops at stage 133 after stage 132, when calculation time $t_i$ reaches the final time indicated by address zone $AZ_4$ of the descriptor.

Examples of the initiation of subprograms are given hereinafter for signal descriptors respectively without change, with transition or representing frequencies.

| Types | Comments |
|---|---|
| Descriptor 1: no change | |
| Old parameters: Amplitude $A_o$ | Input of |
| Time $t_o$ | parameters |
| New parameters: Time $t=t_1$ | |
| End of test 64 $\mu$s Performance of | |
| S/PROG: For $T_i$ such that $t_o < t_i \leq t_1$ | subprogram |
| Perform $M(i) \leftarrow A_o = R_i$ | $y=f(t)=A_o$ |
| Descriptor 2: Transition | |
| Old parameter: Amplitude $A_o$ | Input of |
| Time $t_i = t_1$ | parameters |
| New parameters: Amplitude A | |
| Time $t_i = t_2$ | |
| Test $0 \leq A_o + A \leq 700_{mV}$ | Performance of |
| Test $t_2 \leq 64 \mu s$ | subprogram |
| S/PROG: For $t_1$ such that $t_1 < t_i < t_2$ | $y = f(t) = A_o - A$ |
| Perform: $M(i) \leftarrow A_o - A = E_i$ | |
| Descriptor 3: Frequency | |
| Old parameters: Amplitude $A_o - A$ | Input of |
| Time: $t=t_2$ | parameters |
| New parameters: Frequency F | Mean value |
| Mean value: $B = 350_{mV}$ | |
| Amplitude: $C = 350_{mV}$ | |
| Time: $t = 64 \mu s$ | |
| Test if $A_o - A \neq B$ perform transition | Performance of |
| $2 \Delta T B \leftarrow 350_{mV}$ | subprogram |
| Test time $\leq 64 \mu s$ | $y = B + C \sin 2\pi F.t$ |
| Test peak value $B + C < 700_{mV}$ | |
| Test $0.5 \leq F \leq 12$ MHz | |
| Test S/PROG.$M_i \leftarrow E_i = C \sin 2\pi F$. | |

At the end of performing a subprogram the procedure returns the operator to stage 120 to ask him to select another signal descriptor.

In this way, several descriptors can be selected, when the sum of the times representing the duration of each elementary signal does not exceed the time of 64 $\mu$s of a television image scanning line.

One test is performed by the procedure in stage 123, which returns the operator to stage 114, when the sum of the elementary signals exceeds the time of 64 $\mu$s.

Figure 14:
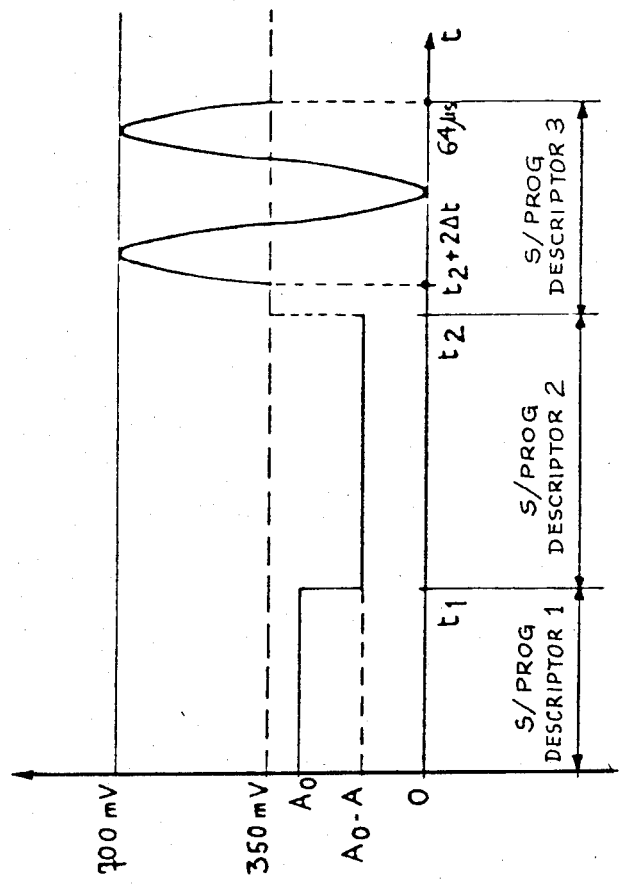
FIG. 14 shows a possible form of a signal generated by the analog test signal generator.

The signal obtained after selection in the order of the aforementioned descriptors 1, 2 and 3 and the performance of the corresponding subprograms, can be displayed by the computer screen 22 (stage 125) in the manner shown in FIG. 14. In the latter, the amplitude of the first elementary signal, corresponding to descriptor 1, is constant and equal to $A_o$ from time $t=0$ to time $t=t_1$. The amplitude of the second elementary signal corresponding to descriptor 2 is also constant, but in this case equal to $A_o - A$ from time $t_1$ to time $t_2$. The signal obtained by performing the subprogram corresponding to descriptor 3 is sinusoidal, its mean value being at amplitude $350_{mV}$ and its peak-to-peak value is $700_{mV}$.

The operation of acquisition device 2 will now be described. The coordinates $X_i$ and $Y_i$ of the signal to be characterized are transmitted by computer 9 in the form of digital signals on connecting bus 86 to registers 80, 81. The television signal to be characterized is selected by selector 65 and is applied on the one hand to the input of sync separator 66 and on the other to the input of separator 71. Computer 9 also transmits the control bits for register 85 for the purpose of masking the outputs of ROM 109 of control device 84 and for controlling the shaping and processing network 74. The horizontal and vertical addresses of the television signal to be characterized contained in registers 80, 81 are transferred into programmable counters 78, 79. Oscillator 68, which is dependent on the sync pulses supplied by sync separator 66, advances the horizontal and vertical counters 69, 70, which in each case supply a component of the current address of the point of the image being transmitted and these horizontal and vertical addresses are compared with the addresses of the desired point contained in counters 78, 79 by comparators 72, 73. When the latter detect an equality between the current and desired addresses, they in each case supply a conversion authorization signal, respectively COMPH and COMPV, which are transmitted to the inputs of control logic 82. At the same time, ROM 109 is addressed by the outputs of vertical counter 78. ROM 109 contains the addresses of the lines for which a characterization of the signals can be directly controlled by computer 9. The selection of These lines is carried out by the masking circuit 111, which receives at its inputs, the mask information from the computer and transmitted across the operation authorization register 110. When coincidence occurs between the bits of the mask information word and the output bits of ROM 109, a conversion authorization signal SAC is supplied by mask 111. ROM 109 and mask 111 make it possible to select several test lines inserted in each image frame and, if the memory is suitably programmed, make it possible to carry out measurements on a complete frame, as well as frame synchronization measurements. The conversion authorizations act on the control input of a digital-analog converter 76 and initiate a conversion cycle whenever they appear. Whenever a conversion cycle ends, an incrementation signal INC is transmitted to an input of control device 84, which retransmits this signal to the incrementation inputs of the vertical and horizontal counters 78, 79, when signal INC is validated by the control amplifiers 83 receiving the control signals from the external computer by bus 86. The validation of the incrementation signal by control device 84 consequently permits an implicit addressing of the samples in accordance with four different modes, namely a mode in which there is no incrementation of address counters 78, 79, a mode in which there is only an incrementation of horizontal address counter 79, a mode in which there is only an incrementation of the vertical address counter 78 and a mode in which the horizontal and vertical counters 78, 79 are simultaneously incremented. In the case when there is no incrementation, the device always samples the same point of the image, namely either one point per frame or one point per image. In the case when only the horizontal address of the image point is incremented by counter 79, the device analyses a line at a rate of one point per image, the address of the line being indicated by the content of counter 78. When there is only a vertical incrementation, the device analyses a vertical line, whose address corresponds to the content of the horizontal counter 79 and this analysis takes place at a rate of one point per line. In the case of both horizontal and vertical incrementation, the device analyses an oblique line at a rate of 1 point per line and the addresses of the successive points analysed are indicated by the content of counters 78 and 79.

The addressing device described hereinbefore permits a very precise use of the analog-digital converter, because the analysis of an image point always takes place at the speed of the frame with sync signals, i.e. 16 kHz in the present embodiment, which represents a relatively slow conversion rate and therefore explains the high accuracy of characterization which can be obtained.

The aforementioned implicit addressing is carried out by address counters 78, 79 and is completed by an explicit addressing carried out by control device 84, which will be more particularly used for very conventional or standardized signal characterizations of the television signals, particularly for the characterization of parameters of test signals inserted in the frame erasure at lines 17, 18, 330 and 331.

It is obvious that the performance principle according to the invention makes it possible to obtain numerous signal variants by acting either on the selection order of the descriptors, because $n! = 1 \times 2 \ldots n$ possible signals can be made to correspond to n descriptors, or by acting on the value of the parameters introduced into each descriptor, or by acting on the choice of mathematical functions representing the different elementary signals. In all cases, it should be noted that the production of a no signal leads to no modification to the equipment and that at the most leads to a writing of a new sampling calculation program corresponding to the new mathematical function introduced and which causes no problem to skilled programmers.

The test signals $V_S$ supplied by the analog signal generator via the output of digital-analog converter 6 are applied by line $1_1$ to the equipment to be tested which can be e.g. the input of a television transmitter and the corresponding output signals of the equipment to be tested or television transmitter are applied by line $1_2$ to the input of acquisition device 2, in order to be brought into a format which can be used by computer 9 and, after transmission on line $1_3$, are arranged in central memory 19 in accordance with a sequence of N digitized samples.

This sequence can then undergo mathematical processing, which is dependent on the task to be performed and which generally consists of carrying out smoothing, interpolation and statistical evaluation operations to permit the computer to give the requested signal characterization results.

It is obviously impossible here to give an exhaustive list of all the characterizations of the signal which can be carried out by the device according to the present invention because, as a result of the digital solution adopted, the number thereof is not limited. For each case, the computer must be appropriately programmed as a function of the nature of the test signals to be applied to the equipment to be tested and as a function of the mathematical processing operations which the operator wishes to carry out on the signals restored by the acquisition device.

The device according to the invention can advantageously be used in television for measuring e.g. the amplitude of the white of the reference signal, for measuring the chrominance of the television signal, for characterizing the transient function of the pulses or for signal transitions.

The measurement of the amplitude of the white of the reference signal can be carried out on the international test line 17 of the image frame at time $t_{14}$ of 14 microseconds after the start of the line sync pulse. The acquisition programme will then consist of requesting the acquisition device to intercept the values of samples $Y_i$ of the signal a number N of times in the vicinity of $t_{14}$. The computer will then perform a subprogram for calculating the mean value of sample $\Sigma Y_i/N$ in order to give the value of the signal corresponding to the white level. Other subprograms can be performed to give the signal-to-noise ratio, the possible slope of the signal, etc. With the aid of a further developed program, it is possible to carry out beforehand, the measurement of the black level of the television signal in order to obtain the true value of the white level and, bearing in mind the measured variations due to the noise, the acquisition device will be controlled to acquire an adequate number of data to ensure that the measurement performed is significant.

The chrominance of the television signal can be measured either on line 330, or on line 331 of the PAL international television standard, which contain the signals intended for this use. By intercepting the signal at the same point in the image frame, the acquisition device always intercepts one signal sample per image and, as the component of the chrominance signal of the PAL signal in an image is phase-displaced by 90° relative to the chrominance component of the preceding image, it is easy to reconstitute in a sequence of $4 \times N$ successive values, the chrominance and luminance components in amplitude and in phase of the PAL signal.

The characterization of a transient function requires the acquisition of a data sequence containing the transient to be characterized, the calculation by one of the known curved interpolation methods, e.g. the Lagrange interpolation method of the values Vi at intermediate times, or the calculation by linear interpolation at the end of the characteristic times of the transient function, e.g. at times T0 and T1 of the half-amplitude values of the pulse.

By examining the sequence of values acquired and the interpolated values, a more developed procedure can give the ballistic factors before and after the pulse. It would be possible to calculate a pattern of factor k, which is not intercepted by the thus reconstituted signal.

In general, all the usual parameters of the television signal can be characterized by a processing of the sequence of digital data acquired under appropriate conditions. With a 10 bit acquisition device and a 32 NS acquisition time, the accuracy of characterization clearly exceeds 1%.

The device according to the invention is able to carry out relatively complex characterizations as a result of its test signal generator, which enables it to produce a specific test signal facilitating the desired characterization. A standard example would be the characterization of the transit time function. Normally, this characterization requires complicated and costly equipment. By producing a test signal of known frequency and phase, designated relative to the horizontal synchronization times of the television signal, the device according to the invention permits the characterization of the transit time in a pass band, which is a function of the sampling frequency of the system.

Although the device has been described with particular reference to the characterization of television signals, it is obvious that it can also be used in other signal characterization systems and can easily be incorporated into the various components of a characterization or measuring system which is assisted by a computer. In this case, the operation of the device will be determined by a characterization or measurement program, which will determine the total or fragmentory acquisition parameters of the signals necessary for performing the task in question. For example, this programme will determine the horizontal and vertical address of the starting point of the signals to be acquired, the number of points to be acquired, the acquisition conditions, as well as the acquisition trajectory. The computer will then pass the control parameters to the device, which will arrange them in corresponding control registers. The device will acquire the requested data and gradually transmit them to the computer, which will arrange them or accumulate them in a central memory and will stop the process when the data have been completely transferred.

What is claimed is:

1. A device for testing electronic equipment, comprising:
    an analog test signal generator for providing test signals for testing said electronic equipment wherein said generator includes a digital computer, a digital-analog converter coupled to said digital computer and a means for storing said test signals in the form of digital signals;
    a device for the acquisition of a signal supplied by said tested electronic equipment in response to said test signals received by said tested equipment; and
    display means controlled by said computer for the purpose of displaying the signals transmitted the test signal generator and the signals received by the acquisition device, wherein
    said digital computer includes a microprogrammed processing unit for producing said digital signals which microprogrammed processor unit includes a calculation means, said digital computer further comprising a means for storing signal descriptors wherein said means for storing signal description is addressed by a keyboard through said digital computer, a means for storing program instruction sequences, a means for storing data for obtaining said digital signals, a means for transferring said stored samples and said means for transferring further including a means for transferring said digital signals to said digital-analog converter and wherein
    said signal descriptor storage means comprises, for each descriptor, a zone indicating the type of descriptor, a zone for storing the starting address of the instruction sequence to obtain samples corresponding to said descriptor, address zones for an operating area for storing the parameters relative to the signal in the data storage means and a starting address zone of a sample arrangement area into the storage means.

2. A device according to claim 1, wherein the operating area for storing the parameters comprises a zone for storing a parameter giving the amplitude of the first sample of the signal, a zone for storing the parameter giving the amplitude of the last sample, and a zone for storing the time of generating the last sample.

3. A device according to claim 2, wherein the analog test signal generator comprises a readwrite memory interposed between the digital-analog converter and the storage means, as well as means for synchronizing the transfer of data stored within the read-write memory to the digital-analog converter.

4. A device according to claim 3, wherein the read-write memory is addressed by an address counter controlled by the computer for writing samples into said memory and controlled by synchronizing means for reading the samples in said memory.

5. A device according to claim 4, wherein it further comprises demultiplexers for writing the samples into the read-write memory and a multiplexer for transferring the samples from this memory to the analog-digital computer.

6. A device according to claim 5, wherein the demultiplexers are controlled by the computer.

7. A device according to claim 6, wherein the multiplexer is controlled by the synchronizing means.

8. A device according to claim 1, wherein the acquisition device comprises a generator of the current address of the signal at the input of the device, a unit for sampling the signal received by the device and a comparator connected by one input to the output of the current address generator, another input of the comparator receiving the address of the signal which is to be acquired and the comparator output supplying a signal for controlling the sampling unit in order to authorize the acquisition of the current signal present at the input of the device, when the address of the current signal is equal to the address of the signal which is to be acquired.

9. A device according to claim 8, wherein the sampling unit comprises a sampler and a control device addressed by the current address generator for supplying preprogrammed control signals to the sampler.

10. A device according to claim 9, wherein the sampling unit comprises a control register for validating or partly masking the preprogrammed control signal supplied by the control device.

11. A device according to claim 10, wherein the sampling unit comprises a digital-analog converter connected to the output of the sampler.

12. An apparatus according to claim 1, wherein said tested electronic equipment is a television and wherein the device for the acquisition of the television signals from the tested equipment comprises a current address generator formed by a first counter advancing with the timing of the sampling times of the signals of the current point of the television image present at the input of the acquisition device to give the address of the current point on its line in the television image and a second counter advancing with the timing of the line sync signals of the television signal to give the address of the line of the current point.

13. An apparatus according to claim 12, wherein the television signal acquisition device comprises a sampling unit incorporating a first register for storing the address of the point on the line to be sampled and a second register for storing the line address of the point to be sampled.

14. An apparatus according to claim 13, wherein the sampling unit also comprises first and second programmable counters which can be respectively loaded by the content of the first and second registers for storing the point to be sampled.

15. An apparatus according to claim 14, wherein the comparison device of the acquistion device comprises a first comparator connected by one input to the output of the first counter of the current address generator and connected by a second input to the output of the first programmable counter of the sampling block, as well as a second comparator connected by one input to the output of the second counter of the current address generator and connected by a second input to the output of the second programmable counter of the sampling unit for detecting an equality between the address of a current point and the address of the desired point contained in the first and second programble counters and authorize the control of the sampler.

16. An apparatus according to claim 15, wherein the analog-digital converter of the sampling device supplies, at the end of the conversion cycle, signals for incrementing by one unit the content of the first and second programmable counters.

17. An apparatus according to claim 16, wherein the signals for incrementing the content of the first and second programmable counters are validated by the control device of the television signal acquisition device.

18. An apparatus according to claim 17, wherein the sampling unit also comprises a network for processing the television signals received, interposed between the sampler and the input of the acquisition device.

* * * * *